United States Patent
Farokhzad

[19]

[11] Patent Number: 6,145,107
[45] Date of Patent: *Nov. 7, 2000

[54] METHOD FOR EARLY FAILURE RECOGNITION IN POWER SEMICONDUCTOR MODULES

[75] Inventor: Babak Farokhzad, Leinfelden, Germany

[73] Assignee: Siemens Aktiengesellschaft, Munich, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/677,027

[22] Filed: Jul. 8, 1996

[30]    Foreign Application Priority Data

Jul. 7, 1995 [DE] Germany ............... 195 24 871

[51] Int. Cl.[7] .................................................. G06F 13/00
[52] U.S. Cl. ............................. 714/745; 257/355
[58] Field of Search ................ 371/28, 21.4, 22.5, 371/22.6; 327/480, 434, 479, 77, 7, 40–42, 50, 65, 331; 363/52–54, 128–129, 71, 46; 257/355–358, 401, 139; 324/418, 422; 395/183.06; 714/745, 733, 734, 735; 307/350

[56]    References Cited

U.S. PATENT DOCUMENTS

| | | | |
|---|---|---|---|
| 4,380,045 | 4/1983 | Ishii | 363/54 |
| 4,642,616 | 2/1987 | Goodwin | 340/654 |
| 4,745,339 | 5/1988 | Izawa et al. | 315/130 |
| 5,061,863 | 10/1991 | Mori et al. | 307/350 |
| 5,187,387 | 2/1993 | Kawauchi | 307/350 |
| 5,345,377 | 9/1994 | Edwards | 363/71 |
| 5,396,117 | 3/1995 | Housen et al. | 327/480 |
| 5,442,216 | 8/1995 | Gough | 257/355 |
| 5,483,148 | 1/1996 | Torrey | 323/205 |
| 5,559,438 | 9/1996 | Bedouet et al. | 324/418 |
| 5,572,416 | 11/1996 | Jacobs et al. | 363/89 |
| 5,612,488 | 3/1997 | Yamamoto et al. | 73/1 D |
| 5,640,095 | 6/1997 | Beier et al. | 324/522 |

FOREIGN PATENT DOCUMENTS

| | | | |
|---|---|---|---|
| 0 599 605 A2 | 6/1994 | European Pat. Off. | 327/480 |
| 3146958 C1 | 4/1983 | Germany . | |
| 4213606 A1 | 10/1992 | Germany . | |
| 4334386 A1 | 4/1994 | Germany . | |

OTHER PUBLICATIONS

Proceedings of the 20th International Symposium for Testing and Failure Analysis, "Reliability Testing and Analysis of IGBT Power Semiconductor Modules", P. Jacob et al., pp. 319–325, Nov. 1994.

Quality and Reliability Engineering International, "Electrical Measurements as Performance Indicators of Electromigration", B.K. Jones et al., vol. 10, 315–318, Feb. 1994.

Electronics, "Harmonic Testing Pinpoints Passive Component Flaws", Vilhelm Peterson et al., pp. 93–100, Jul. 1966.

*Primary Examiner*—Nadeem Iqbal
*Attorney, Agent, or Firm*—Hill & Simpson

[57]    ABSTRACT

A method for early failure recognition in power semiconductor modules which employs a measurement across a resistor between a bonded emitter terminal and a bonded auxiliary emitter terminal that identifies the degradation of the bond point which triggers an early warning signal so that the power semiconductor module can be changed before failure and the overall reliability of an electronic power system can thereby be increased.

9 Claims, 1 Drawing Sheet

METHOD FOR EARLY FAILURE RECOGNITION IN POWER SEMICONDUCTOR MODULES

BACKGROUND OF THE INVENTION

1. Field of the Invention

The present invention is to directed to a method for early failure recognition and to generate a warning signal prior to disconnection of bond connection in a power semiconductor module when such a failure is detected. The method of the present invention allows an increase in the overall reliability of electronic power systems which employ IGBT (Isolated Gate Bipolar Transistor) modules through the early detection of failures.

2. Description of the Related Art

Power semiconductor modules, such as for example IGBT modules, provide significant improvements in electronic power systems due to their excellent electrical characteristics. However, high-power IGBT modules are not used in failure-critical systems, such as, for example, subway or street rail systems or in elevators, since they cannot meet the reliability demands placed on them by such systems. This is due in part to the fact that the bonding connections of a module represent an essential weak point of modules of this type. Previously, there was no practical method for detecting failure of the bonding connections which would allow a system using such a device to switch to a non-failing component.

SUMMARY OF THE INVENTION

The present invention relates to a method for detecting faults in the bond connections of IGBT modules which overcomes the shortcomings of the prior art thereby broadening the potential applications for IGBT devices. In a preferred embodiment, when the system senses a fault or failure in a bond connection, the system provides a warning signal identifying the failure and allowing a user to switch to a non-failing component.

DETAILED DESCRIPTION OF THE PREFERRED EMBODIMENTS

Figure 1:
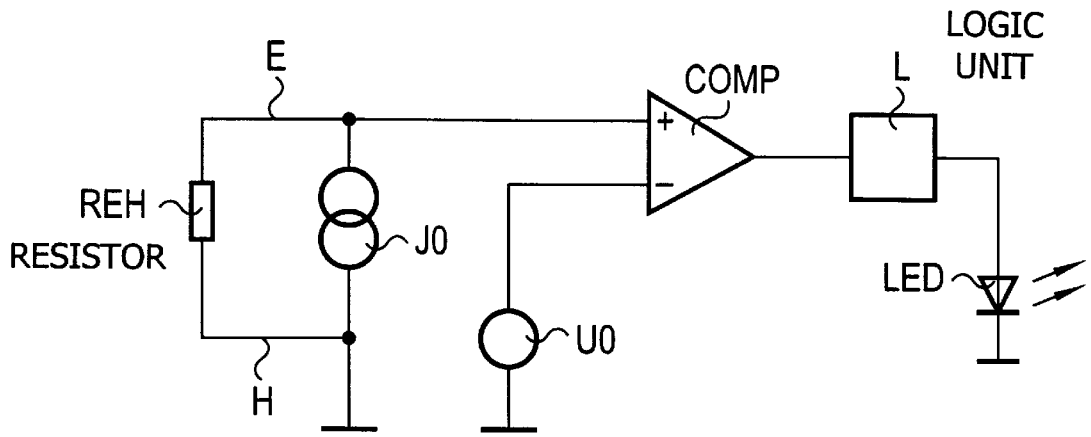
FIG. 1 is a schematic diagram of a first embodiment of the present invention.

FIG. 1 is a schematic diagram of a first embodiment of the present invention, which employs a resistor REH, a DC source J0, a reference voltage U0, a comparator COMP, a logic unit L and a light-emitting diode LED. The resistor, REH, is connected between a bonded emitter terminal E and a bonded auxiliary emitter terminal H of a power semiconductor module. The physical spacing of the two terminals E and H is typically on the order of approximately 0.1 mm.

A constant current source J0 is applied to the resistor REH to provide a current of, for example, 100 mA. The voltage drop at the resistor REH is a function of the bond point degradation, and can be compared with a reference voltage U0. This comparison is done with the comparator COMP. If the voltage drop exceeds the reference voltage U0, a warning signal is displayed, e.g. by means of a logical circuit L and a display unit comprised of a light-emitting diode LED. Prior to disconnection of the bond connection, the resistance of the bond point increases from about 20 m$\Omega$ to approximately 100 to 500 m$\Omega$. This increase in resistance takes place in a time interval that provides sufficient time for the changing the corresponding module once the warning has been sounded.

Figure 2:
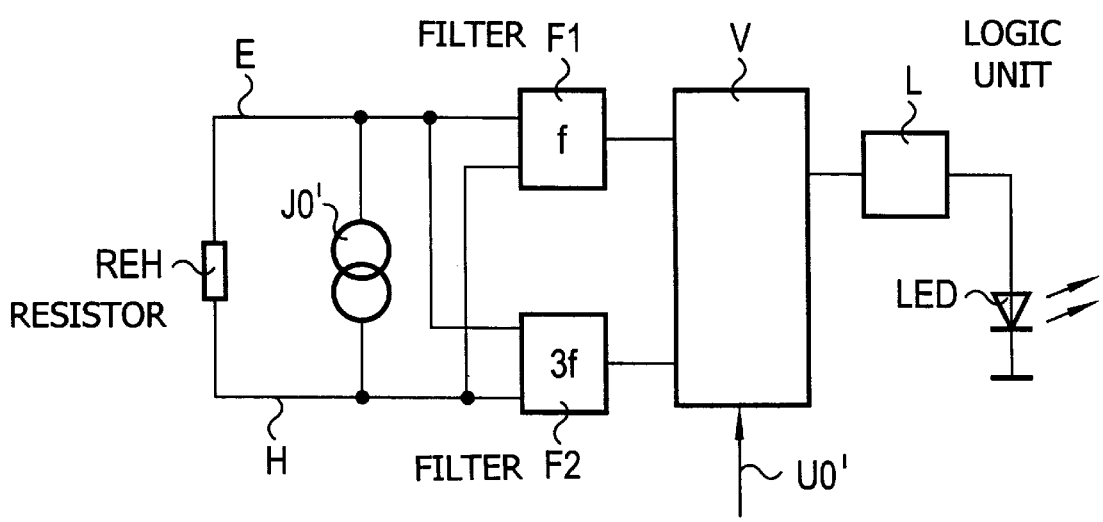
FIG. 2 is a schematic diagram of a second embodiment of the present invention.
Figure 3:
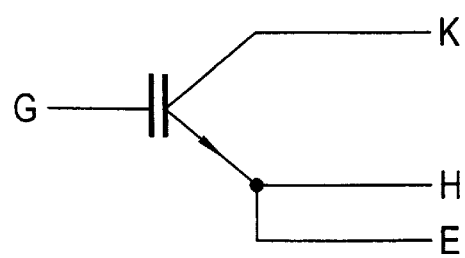
FIG. 3 is a circuit diagram of an IGBT having an auxiliary emitter.

FIG. 2 shows an alternate embodiment for carrying out the method of the present invention. In this alternate embodiment, an AC source J0' with a constant base frequency f and a constant amplitude is provided in place of the DC source J0 and is connected between a bonded emitter terminal E and a bonded auxiliary terminal H of the power semiconductor module. A first filter circuit F1 has an output connected to an input of the comparator COMP for filtering the fundamental wave having the frequency f. A second filter circuit F2 for filtering of the third harmonic with the frequency 3f is also connected across the resistor. A processing unit V has a reference voltage U0' connected to an input.

A sinusoidal current, which in the exemplary embodiment has an amplitude of approximately 0.7 A and whose frequency is 1 kHz, is applied across the resistance REH. The voltage drop at the resistor REH has a fundamental wave frequency f which is extracted by filtering with the first filter F1. The third harmonic, having frequency 3f, is extracted by filtering with a second filter F2. The fundamental wave and the third harmonic thereby form measurement quantities for determining bond point degradation. These values are compared with the reference voltage value U0'. This is performed in a processing unit V, whereby the processing unit V consists of a unit for weighted summation. In the exemplary embodiment this comprises an operational amplifier wired with two input resistors and a feedback resistor. It is also conceivable to use the values 0 and a correspondingly simplified circuit for the weighting factors of the fundamental wave and of the third harmonic. Alternatively, the filters F1 and F2 can be replaced by a digital signal processor with FFT capability (fast Fourier transform), and/or the processing unit V can be replaced by a neural network, a fuzzy controller or a neuro-fuzzy unit.

If the output voltage of the processing unit exceeds the reference value, an early warning signal is produced. This is displayed, as in the first embodiment of the invention, using a logical circuit L and a display unit LED. Experimental results have shown that during transition from an undamaged state to a damaged state, the amplitude of the fundamental wave increases by a factor of about 1.5, and that of the third harmonic by a factor of about 12. A particular advantage of the invention is that the measurement is not influenced or altered by the characteristics of the semiconductor chip.

The present invention is subject to many variations, modifications and changes in detail. It is intended that all matter described throughout the specification and shown in the accompanying drawings be considered illustrative only. Accordingly, it is intended that the invention be limited only by the spirit and scope of the appended claims.

I claim as my invention:

1. A method for early failure recognition in a power semiconductor module comprising the steps of:

providing a resistor between an emitter terminal and an auxiliary emitter terminal of the power semiconductor module wherein a resistance of the resistor is dependent on a bond point degradation of the emitter terminal and auxiliary emitter terminal;

providing a substantially constant current flow across first and second terminals of the resistor which is independent of the load current through the emitter; and providing a warning signal when a voltage drop across the resistor exceeds a predetermined value.

2. A method for early failure recognition in a power semiconductor module according to claim 1, in which said current flow is a constant DC current applied across the resistor and a voltage drop across the resistor is compared in a comparator with a reference voltage to trigger said warning signal.

3. A method for early failure recognition in a power semiconductor module according to claim 1, wherein the step of providing a current flow across the resistor comprises a step of providing a sinusoidal alternating current having a constant frequency and a constant amplitude across the resistor, and the method further comprises:

extracting a fundamental frequency signal by filtering a signal across the resistor with a first filter and extracting a third harmonic signal with a second filter; and producing an evaluation signal in a processing unit with the fundamental frequency signal and third harmonic signal and further wherein the evaluation signal is compared with a reference voltage.

4. A method for early failure recognition in a power semiconductor module according to claim 3, wherein the step of producing the evaluation signal comprises performing a weighted summation on the fundamental frequency signal and the third harmonic signal.

5. A method for early failure recognition in a power semiconductor module according to claim 2, wherein the warning signal is generated using a logic unit and an optical display.

6. A method for early failure recognition in a power semiconductor module according to claim 3, wherein the warning signal is generated using a logic unit and an optical display.

7. A method for early failure recognition in a power semiconductor module according to claim 4, wherein the warning signal is generated using a logic unit and an optical display.

8. A method according to claim 1, wherein the power semiconductor module is an IGBT module.

9. A circuit for recognizing a failure in a power semiconductor module comprising:

a resistor connected between an emitter and an auxiliary emitter of the power semiconductor module wherein a resistance of the resistor is dependent on a bond point degradation of the emitter terminal and auxiliary emitter terminal;

a current source to provide a substantially constant current flow across bond connections of an emitter terminal and an auxiliary emitter terminal;

a sensor for sensing a change in the magnitude of a current flowing across the resistor; and an alarm for sounding a warning when a voltage drop across the resistor exceeds a predetermined value.

* * * * *